(12) United States Patent
Huang et al.

(10) Patent No.: US 6,391,666 B2
(45) Date of Patent: *May 21, 2002

(54) METHOD FOR IDENTIFYING DEFECTIVE ELEMENTS IN ARRAY MOLDING OF SEMICONDUCTOR PACKAGING

(75) Inventors: Ya-Hui Huang, Taichung; Chih-Chin Liao, Changhwa Hsien; Tzong-Dar Her, Taichung, all of (TW)

(73) Assignee: Siliconware Precision Industries Co., Ltd., Taichung Hsien (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/475,007

(22) Filed: Dec. 30, 1999

(51) Int. Cl.[7] .................................................. H01L 21/66
(52) U.S. Cl. ............................................................ 438/15
(58) Field of Search ......................... 438/5–18; 700/90, 700/110, 121

(56) References Cited

U.S. PATENT DOCUMENTS

| | | | | |
|---|---|---|---|---|
| 5,923,959 A | * | 7/1999 | Mess | 438/126 |
| 5,985,680 A | * | 11/1999 | Singhal et al. | 438/7 |
| 6,048,755 A | * | 4/2000 | Jiang et al. | 438/118 |
| 6,122,562 A | * | 9/2000 | Kinney et al. | 700/121 |
| 6,182,883 B1 | * | 2/2001 | Nikmanesh | 228/33 |

* cited by examiner

*Primary Examiner*—Michael J. Sherry
*Assistant Examiner*—Scott B. Geyer
(74) *Attorney, Agent, or Firm*—J.C. Patents

(57) ABSTRACT

The present invention is a method for identifying defective elements in array molding of semiconductor packaging for mini BGA packaging substrate which comprises a circuit zone and a periphery zone. The method of the present invention is first to form a plurality of package sites disposed in array in the circuit zone, and to form a plurality of marks in a periphery zone. When a defective element is found in the package sites, a symbol is put at the mark or an electronic file is employed to record the location of the defective element, thereby, the defective element in the package sites of the molding array in the circuit zone can be identified.

5 Claims, 2 Drawing Sheets

METHOD FOR IDENTIFYING DEFECTIVE ELEMENTS IN ARRAY MOLDING OF SEMICONDUCTOR PACKAGING

BACKGROUND OF THE INVENTION

1. Field of the Invention

The present invention relates to a method for identifying defective elements in array molding of semiconductor packaging, and more particularly to a method for identifying defective elements in array molding of semiconductor packaging of mini ball grid array (BGA) type.

2. Description of Related Art

In light of the trend of "Light, Thin, Short, and Small" of electronic products, in only a decade, the chip packaging technology of semiconductors has developed from the "Insertion Mount" type in the 1980s to the "Chip Scale Package (CSP)" technology of today. The "Insertion Mount" type of chip packages simply mounts the chip on the Print Circuit Board (PCB) while the "Chip Scale Packages (CSP)" have high density of electronic devices and are also three-dimensional instead of two-dimensional such as those that were made previously.

Following the development in the packaging technology of ultra-fine-pitch, the chip packaging technology performed by the use of the lead frame can not satisfy the requirements of this new trend anymore. And the ball grid array (BGA) package with its dominant advantages has imperceptibly become the main stream of packaging type nowadays, the mini BGA type of packaging is one of the examples.

The so called mini BGA type of package is a package that is fabricated by first forming a plurality of package sites in array, then forming electrical connections between the dies and the package sites respectively, and thereafter using a molding compound to protect the die. In this way, the dies can electrically exit out to undertake signal transmission through the connecting points formed in ball shape on the package sites and disposed in array.

FIG. 1 is a schematic top view of a mini BGA packaging substrate according to the prior art. As shown in FIG. 1, a common mini BGA packaging is first to form a plurality of package sites 104, which is disposed in array, in the circuit zone 102 of the mini BGA packaging substrate 100. Next, a plurality of dies is electrically connected to the package sites 104 respectively, then a molding process is performed to encase the whole area of the circuit zone 102 to protect the dies and bond wires by a molding compound. Thereafter, all one has to do is to saw the overall package into package sites 104 along the borderlines of the array to complete the mini BGA packaging process.

An inspection process is performed after the package sites 104 are formed in array on the mini BGA packaging substrate 100 and before the plurality of dies is electrically connected to each of the package sites 104 respectively in accordance with the foregoing statement. The purpose of the inspection is to judge initially if there are any defective package sites 104, in the meantime, to mark them in order to differentiate them from the good ones. The way of doing this is to put an "X" mark on those defective package sites such as 104a in FIG. 1.

However, the mark put on some of the package sites 104, which are initially judged as defective ones, will be covered by the molding compound after the processes of die bonding and array molding are completed. Consequently, the defective elements can not be identified.

In the light of the foregoing disadvantage that the conventional array molding is unable to identify the defective elements after the array molding is completed, the present invention provides an identification method for identifying the defective elements.

SUMMARY OF THE INVENTION

The present invention provides a method for identifying defective elements in array molding of semiconductor packaging. The method is first to provide a mini BGA packaging substrate. Next, it provides a circuit zone on the mini BGA packaging substrate wherein a plurality of package sites disposed in array are formed in the circuit zone. Then, a plurality of marks representing the locations of each of the package sites are formed in the periphery zone other than the circuit zone on the mini BGA packaging substrate. Thereafter, it performs an inspection process to those package sites in order to find out the defective elements in the package sites. Then, it puts a symbol at those marks in the periphery zone wherein the symbol put at the marks represents the location of defective elements in the package sites. It then performs electrical connection between a plurality of dies and the package sites respectively. Finally, it performs an array molding process by the use of a molding compound to cover the dies and the package sites but not to cover the periphery zone. Therefore, one can identify the locations of the defective elements in the package sites.

The present invention also provides a method for identifying defective elements in array molding of semiconductor packaging. The method is first to provide a mini BGA packaging substrate. Next, it provides a circuit zone on the mini BGA packaging substrate wherein a plurality of package sites disposed in array are formed in the circuit zone. Then, a plurality of marks representing the locations of each of the package sites is formed in the periphery zone. Thereafter, an inspection process is performed to those package sites in order to find out the defective elements in the package sites. Then, the locations of defective elements of the package sites are recorded in an electronic file so that the locations of the defective elements in the package sites can be identified at any time. Then electrical connection is formed between a plurality of dies and the package sites respectively. Finally, an array molding process is performed by the use of a molding compound to cover the dies and the package sites. In this way, the locations of defective elements in the package sites can be identified from the electronic files.

BRIEF DESCRIPTION OF DRAWINGS

The objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1:
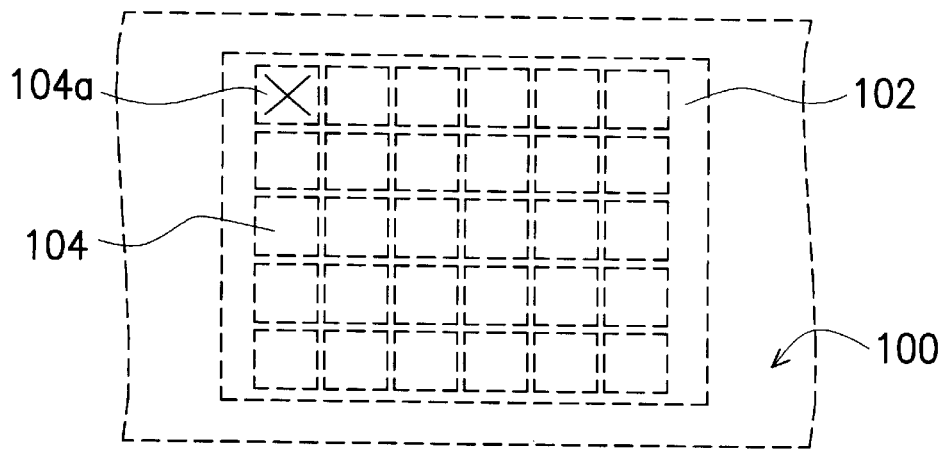
FIG. 1 is a schematic top view of a mini BGA packaging substrate according to the prior art.
Figure 2:
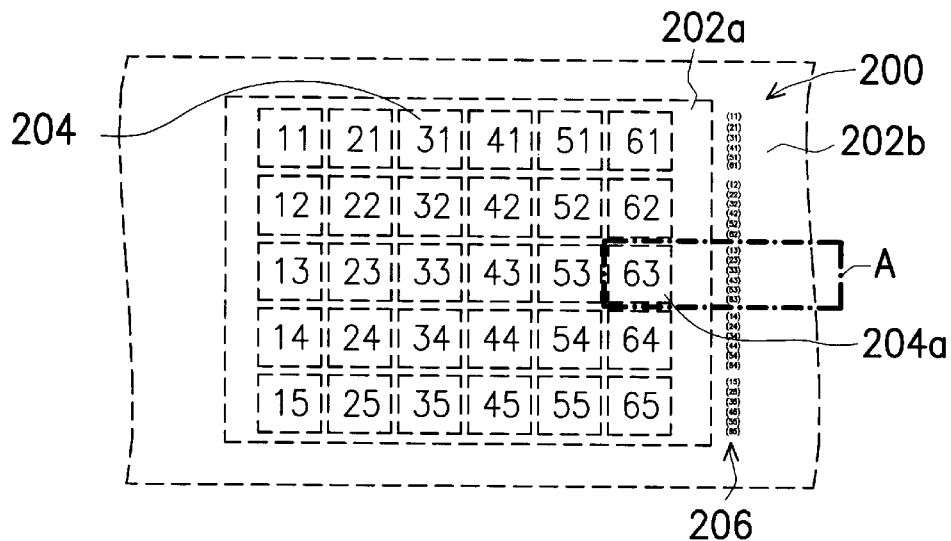
FIG. 2 is a schematic top view of a mini BGA packaging substrate of a preferred embodiment according to the present invention.

FIG. 2 is a schematic top view of a mini BGA packaging substrate of a preferred embodiment according to the present invention. As shown in FIG. 2, a mini BGA packaging substrate 200 can be separated into a circuit zone 202a and a periphery zone 202b. The circuit zone 202a is for forming a plurality of package sites 204, which is disposed in array, in order to electrically connect to a plurality of dies formed in the subsequent process. Mark 206 is formed on the periphery zone 202b to represent the locations of each of the package sites 204. The material used by the mini BGA packaging substrate 200 can be a Bismaleimide-Triazine (BT) epoxy for instance.

The mark 206, which is formed in the periphery zone 202b and is used for representing the locations of each of the package sites 204, can be formed by a two-dimensional array of coordinates. Thus, the representative location of each of the package sites 204 can be expressed by the (X,Y) form.

Figure 3:
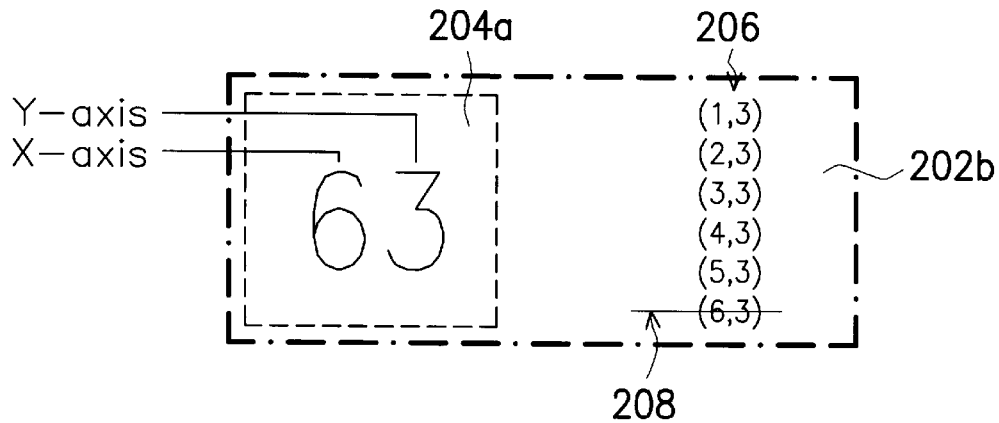
FIG. 3 is a schematic enlarged view of the area "A" as shown in FIG. 2 according to the present invention.

FIG. 3 is a schematic enlarged view of the area "A" as shown in FIG. 2 according to the present invention. As shown in FIG. 3, if a defective element is found at location (6,3) of package site 204a (see also in FIG. 2). Then, a symbol 208 with a cross-wise line segment, for example, can be drawn on the top (6,3) of the mark 206 to be identified.

Since the molding process, which is performed after the dies complete electrical connection, of the mini BGA packaging substrate 200 encases the molding compound on the package sites 204 only, but not on the periphery zone 202b, thereby, the mark 206 will not be covered by the molding compound. Consequently, the symbol 208 used for labeling a defective element before a molding process is performed will not be covered by the molding compound after the molding process is performed. Therefore, although the molding process is completed, the defective elements can still be identified.

Figure 4:
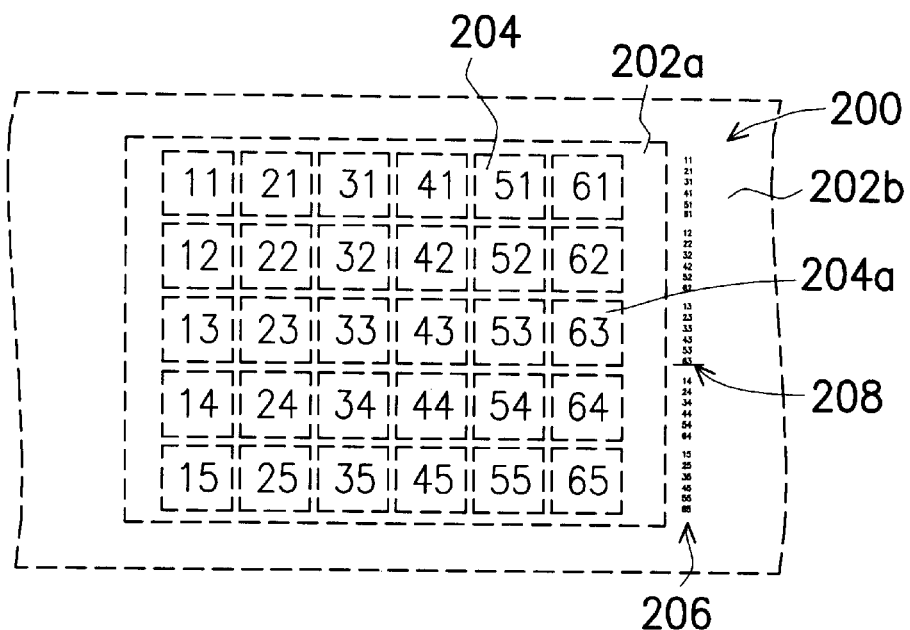
FIG. 4 and FIG. 5 are schematic top views of a mini BGA packaging substrate of another two preferred embodiments according to the present invention.
Figure 5:
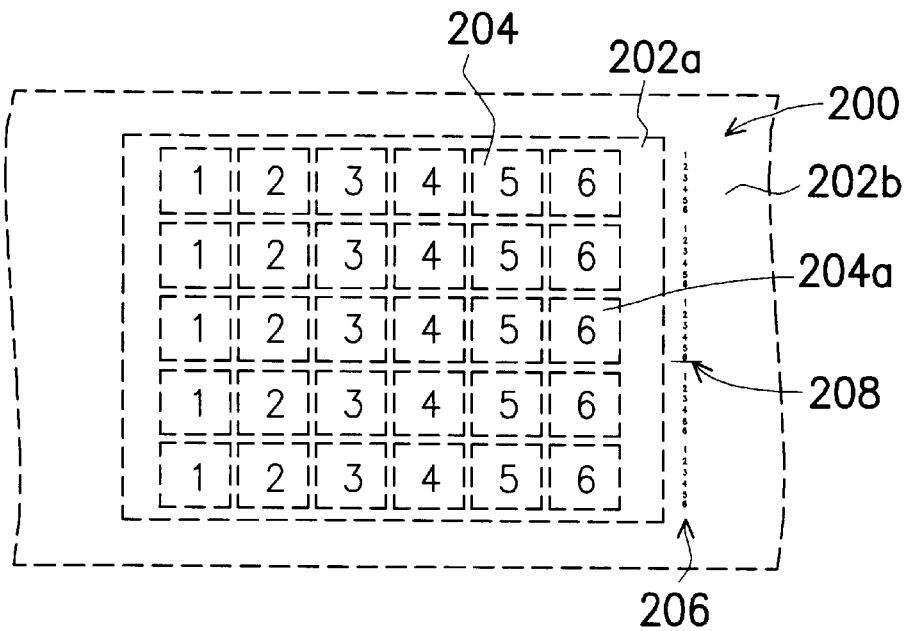

FIG. 4 and FIG. 5 are schematic top views of a mini BGA packaging substrate of another two preferred embodiments according to the present invention. As shown in FIG. 4, besides using (X,Y) as a mark 206 to stand for the location of the package sites 204, a mark in the form of XY can also be employed.

As shown in FIG. 5, a mark 206 having a one-dimensional array can also be employed, for instance, the locations of each of the package sites 204 in X-column can be labeled on a side of each of the package sites 204 in Y-row on the periphery zone 202b.

However, the space available in the periphery zone 202b during the packaging process of the mini BGA packaging substrate 200 is decreasing due to the advent of integration of semiconductors. Therefore, the mark used for representing the locations of each of the package sites is getting harder to form in the periphery zone. This is because the package sites 204 used by the mini BGA packaging are densely disposed, and the design of the package is also under the consideration of "striving for the best" and cost-effectiveness in the packaging process. To overcome this problem, the mark 206, as mentioned above in various embodiments, can also be stored in a computer by the means of electronic files. Based on this, as long as the electronic files that record the locations of the defective elements are moving together with the packaging process, the locations of the defective elements can still be identified even after the molding process is completed.

To sum up, the present invention first forms a locating mark on the periphery zone, which does not have array molding package sites formed, of a mini BGA packaging substrate in order to label the locations of the package sites. When defective elements are found in the package sites, one can put symbols at the mark on the periphery zone in the locations corresponding to those of the package sites, or record them by the use of electronic files. In this way, the defective elements in the package site array can be identified even after the array molding process is completed.

In addition, the symbols for identifying the defective elements of the present invention are labeled at the corresponding mark on the periphery zone that is not covered by the molding compound or are recorded in electronic files. Therefore, the defective elements can still be identified easily even after the molding process is completed.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for identifying a defect in array molding of semiconductor packaging, comprising:

providing a plurality of dies;

providing a mini BGA packaging substrate having a circuit zone and a periphery zone surrounding the circuit zone, wherein the circuit zone has a plurality of package sites in array and is distinct from the periphery zone free from the package sites;

forming a plurality of marks only in the periphery zone of the packaging substrate, wherein the marks represent the locations of each of the package sites;

performing an inspection process to those package sites in order to find a defect in the package site;

labeling the mark that represents the location of the package site in the circuit zone where the defect is detected;

forming electrical connections between dies and the package sites respectively; and performing a molding process by the use of a molding compound to cover the circuit zone with the periphery zone which has the marks being exposed.

2. The method for identifying defective elements in array molding of semiconductor packaging of claim 1 wherein the material employed by the mini BGA packaging substrate comprises Bismaleimide-Triazine (BT) epoxy.

3. The method for identifying defective elements in array molding of semiconductor packaging of claim 1 wherein those marks are formed in a two-dimensional coordinate array.

4. The method for identifying defective elements in array molding of semiconductor packaging of claim 1 wherein those marks are formed in a one-dimensional coordinate array.

5. The method for identifying defective elements in array molding of semiconductor packaging of claim 1 wherein a method to label a defective element is to draw a cross-wise line segment at the mark representing the defective element in the package sites.

* * * * *